(12) United States Patent
Seyyedy et al.

(10) Patent No.: US 7,126,200 B2
(45) Date of Patent: Oct. 24, 2006

(54) INTEGRATED CIRCUITS WITH CONTEMPORANEOUSLY FORMED ARRAY ELECTRODES AND LOGIC INTERCONNECTS

(75) Inventors: Mirmajid Seyyedy, Boise, ID (US); Glen E. Hush, Boise, ID (US); Mark E. Tuttle, Boise, ID (US); Terry C. Vollman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 10/369,277

(22) Filed: Feb. 18, 2003

(65) Prior Publication Data

US 2004/0160795 A1    Aug. 19, 2004

(51) Int. Cl.
    H01L 23/48    (2006.01)
(52) U.S. Cl. .................. 257/421; 257/758; 365/174
(58) Field of Classification Search ................ 257/758, 257/751, 762, 296, 421, 427; 365/63, 51, 365/158, 174
    See application file for complete search history.

(56) References Cited

U.S. PATENT DOCUMENTS

| | | | |
|---|---|---|---|
| 4,918,655 A | 4/1990 | Daughton | |
| 5,732,016 A | 3/1998 | Chen et al. | |
| 5,899,742 A | 5/1999 | Sun | |
| 5,945,350 A | 8/1999 | Violette et al. | |
| 5,991,193 A | 11/1999 | Gallagher et al. | |
| 6,005,800 A | 12/1999 | Koch et al. | |
| 6,021,065 A | 2/2000 | Daughton et al. | |
| 6,057,573 A * | 5/2000 | Kirsch et al. | 257/296 |
| 6,130,835 A | 10/2000 | Scheuerlein | |
| 6,147,900 A | 11/2000 | Pohm | |
| 6,156,630 A | 12/2000 | Iyer | |
| 6,211,054 B1 | 4/2001 | Li et al. | |
| 6,255,701 B1 | 7/2001 | Shimada | |
| 6,385,083 B1 | 5/2002 | Sharma et al. | |
| 6,413,788 B1 | 7/2002 | Tuttle | |
| 6,573,604 B1 * | 6/2003 | Kajita | 257/758 |
| 6,590,244 B1 * | 7/2003 | Asao et al. | 257/295 |
| 6,630,718 B1 | 10/2003 | Trivedi | |
| 6,673,715 B1 | 1/2004 | Trivedi et al. | |
| 6,753,241 B1 | 6/2004 | Dennison | |
| 6,794,678 B1 * | 9/2004 | Hasegawa et al. | 257/48 |
| 6,822,279 B1 * | 11/2004 | Soeda | 257/296 |
| 6,855,628 B1 | 2/2005 | Dennison | |
| 6,924,525 B1 * | 8/2005 | Narui et al. | 257/306 |
| 2004/0160795 A1 * | 8/2004 | Seyyedy et al. | 365/63 |

* cited by examiner

*Primary Examiner*—Mark V. Prenty
(74) *Attorney, Agent, or Firm*—Knobbe Martens Olson & Bear LLP

(57) ABSTRACT

The invention relates to interconnects for an integrated circuit memory device. Embodiments of the invention include processes to fabricate interconnects for memory devices in relatively few steps. Embodiments of the invention further include memory devices with metallization layers having unequal pitch dimensions in different areas of the chip, thereby permitting simultaneous fabrication of array electrodes and electrical interconnects in different areas of the chip. This reduces the number of fabrication steps used to make interconnects, thereby speeding up fabrication and reducing production costs.

23 Claims, 3 Drawing Sheets

INTEGRATED CIRCUITS WITH CONTEMPORANEOUSLY FORMED ARRAY ELECTRODES AND LOGIC INTERCONNECTS

BACKGROUND OF THE INVENTION

1. Field of the Invention

The invention generally relates to methods and apparatus for metallization in data storage devices for integrated circuits, and more particularly, to randomly accessible memory devices.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. For example, after a conventional personal computer is powered off, the volatile memory is typically reloaded through a boot up process upon a restart. In addition, certain volatile memories such as DRAM devices require periodic refresh cycles to retain data even when power is continuously supplied.

Nonvolatile memory devices retain data for long periods of time when power is removed. Examples of nonvolatile memory devices include read only memory (ROM), programmable read only memory (PROM), erasable PROM (EEPROM), electrically erasable PROM (EEPROM), flash memory, and the like. These memory devices are also randomly addressable memory devices. Disadvantageously, conventional nonvolatile memories are relatively large (physically), slow, and expensive. Further, conventional nonvolatile memories are relatively limited in write cycle capability and typically can only be programmed to store data about 10,000 times in a particular memory location. This prevents a conventional non-volatile memory device, such as a flash memory device, from being used as general purpose memory.

An alternative memory device is known as magnetoresistive random access memory (MRAM). An MRAM device uses magnetic orientations to retain data in its memory cells. Advantageously, MRAM devices are relatively fast, are nonvolatile, consume relatively little power, and do not suffer from restrictive write cycle limitations. There are many different types of MRAM devices.

In a giant magneto-resistance (GMR) MRAM cell, at least two ferromagnetic layers are separated by a non-magnetic layer. One of the ferromagnetic layers has a relatively high coercivity and is provided a fixed or "pinned" magnetic vector. The other ferromagnetic layer has a lower coercivity, wherein the orientation of its magnetic vector can be "varied" by a field not large enough to re-orient the pinned layer.

In a tunneling magneto-resistance (TMR) cell, the layer of non-magnetic material corresponds to a relatively thin layer of insulating material, which is made thin enough to permit electron tunneling, i.e., quantum mechanical tunneling of electrons from one of the ferromagnetic layers to the other. The passage of electrons through the stack of layered materials depends upon the orientation of the magnetic vector of the soft magnetic or variable layer relative to that of the pinned layer; electrons pass more freely when the magnetic vectors of the variable and pinned layers are aligned.

The demand for larger and larger memory devices is ever increasing. To meet the demand for larger memory, even more memory cells are packed into memory arrays of memory devices. This increases the number of electrodes for memory cells and interconnects for logic throughout the memory device. Electrodes and interconnects are typically fabricated by forming layers of interlayer dielectric (ILD) and layers of metallization. The fabrication of multiple layers of metallization can be time consuming and expensive.

SUMMARY OF THE INVENTION

Embodiments of the invention include a fabrication process and an apparatus for providing interconnects in a memory device. Advantageously, embodiments of the invention contemporaneously form electrodes for memory arrays and interconnects for logic circuits at the same time. This advantageously saves processing steps and time as compared to forming electrodes and forming interconnects in separate steps. With fewer processing steps, integrated circuits can be formed in less time and with fewer sources of error.

One embodiment of the invention is an integrated circuit memory device. The integrated circuit device has a semiconductor substrate assembly. Memory cell storage devices, such as MRAM memory cell storage devices are arranged in a memory array above the substrate assembly. A plurality of metallization layers form electrodes for the memory array. At least one of these metallization layers is also configured to form interconnects for logic circuits. In one embodiment, an optional cladding of a magnetic material, such as nickeliron, forms a magnetic keepe for the electrodes. in one embodiment, the electrodes for the memory array and the interconnects for the logic circuits have unequal pitches. This can advantageously reduce electromigration, reduce distributed capacitance, etc.

Another embodiment of the invention is a method of forming electrodes and interconnects for an integrated circuit memory device. A metallization layer is formed. Electrodes for a memory array and interconnects for logic are simultaneously formed from the metallization layer. This advantageously saves processes steps, thereby speeding up manufacturing processes and decreasing the number of process steps to fabricate electrodes and/or interconnects.

BRIEF DESCRIPTION OF THE DRAWINGS

These and other features of the invention will now be described with reference to the drawings summarized below. These drawings (not to scale) and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The invention relates to metallization for an integrated circuit, including an integrated circuit memory device. Embodiments of the invention include processes to fabricate interconnects for memory devices in relatively few steps. Embodiments of the invention also include memory devices with metallization layers having unequal pitch dimensions in different areas of the chip, thereby permitting simultaneous fabrication of array electrodes and logic interconnects in different areas of the chip. This reduces the number of fabrication steps used to make interconnects, thereby reducing sources of error, speeding up fabrication, and reducing production costs.

Figure 1:
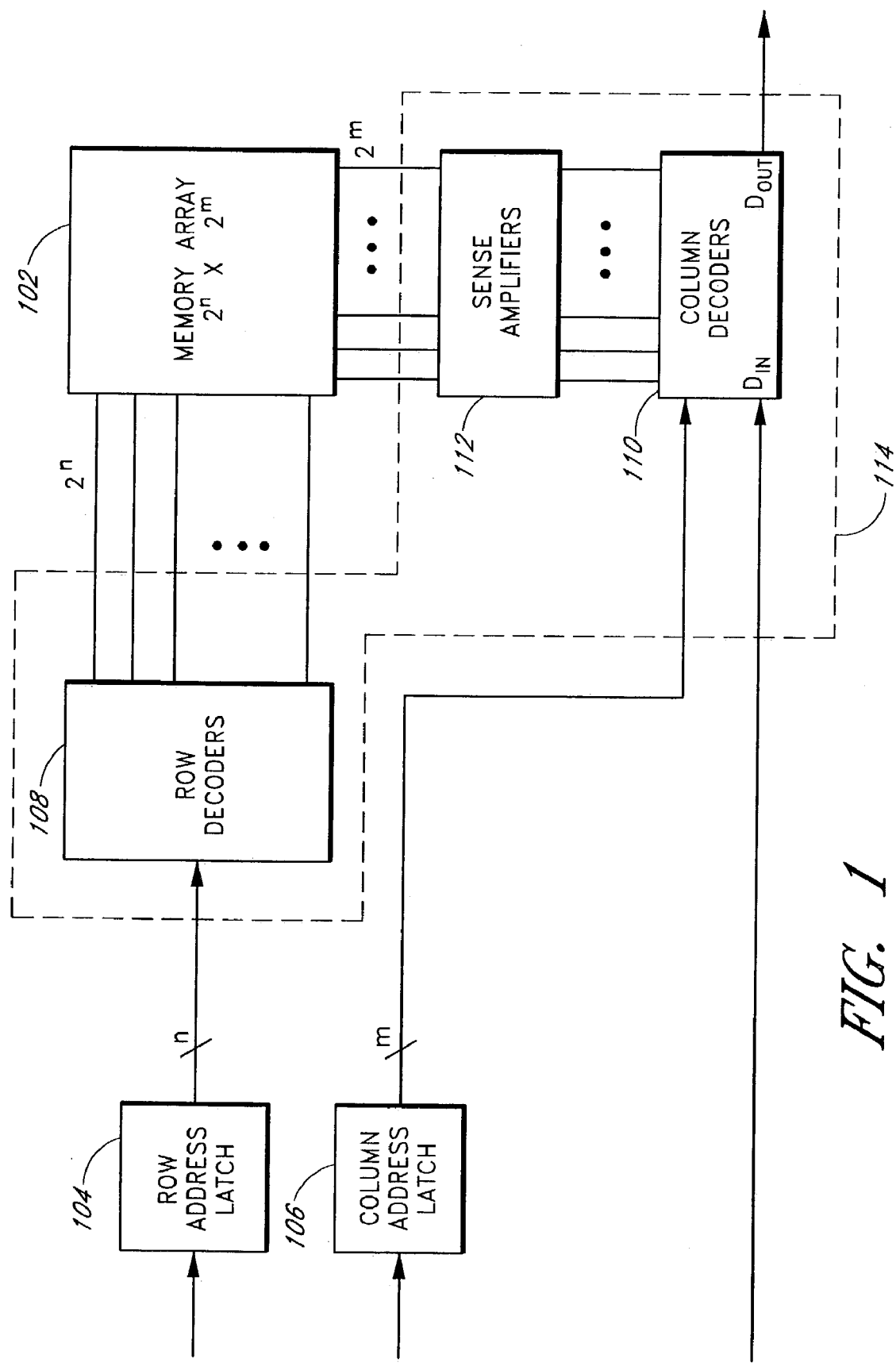
FIG. 1 illustrates a randomly accessible memory device.

FIG. 1 illustrates an example of a portion of a randomly accessible memory device. It will be understood that randomly accessible memory devices can be constructed in a variety of configurations and that the memory circuit illustrated in FIG. 1 is but one example. A memory array 102 of the memory device can also correspond to a broad variety of memory types, including, but not limited to: dynamic random access memory (DRAM) devices; read only memory (ROM); programmable read only memory (PROM); erasable PROM (EPROM); electrically erasable PROM (EEPROM); flash memory; programmable conductor random access memory (PCRAM), and magnetoresistive random access memory (MRAM). The concept advantages and principles have particular application to MRAM fabrication.

For the purposes of clarity, power connections, selected control signals, memory arbiters, additional address decoders, buffers, etc., are not shown in FIG. 1. It should also be noted that the portion of the memory device illustrated in FIG. 1 includes only one data bit, but it will be apparent to the skilled practitioner that the circuit can be duplicated as desired for more data bits.

A particular memory cell within the memory array 102 is selected by row and column. It will be understood that other terms can be used to describe a row or a column, such as word line or bit line. Addresses are provided as inputs to a row address latch 104 and a column address latch 106. Such addressees are typically shared with other latch circuits. A latch control signal (not shown), such as a strobe signal, is used to trigger the row address latch 104 and the column address latch 106. The latch control signal can also be enabled based on address decoding within the memory device.

The latched outputs of the row address latch 104 and the column address latch 106 are provided as inputs to row decoders 108 and column decoders 110, respectively. The row decoders 108 and the column decoders 110 select a row and a column, respectively, within the memory array 102. The column decoders 110 can also provide a port for the writing of data and a port for the reading of data from the array. The column decoders 110 are further coupled to the memory array 102 via sense amplifier circuits 112. The sense amplifier circuits 112 can, for example, read the difference in magneto-resistance in an MRAM cell and thereby provide an indication of the stored magnetic state. In another embodiment, the sense amplifier circuits 112 also include driver circuits for writing data to the memory array 102.

The number of memory cells within the memory array 102 can be relatively large, and the number of rows and columns can correspondingly be large. For example, in the memory device illustrated in FIG. 1, where there are n row address lines and m column address lines, there are $2^n$ and $2^m$ rows and columns, respectively. In one embodiment, where there are n=8 row address lines and m=8 column address lines, there are 256 row lines and 256 column lines, thereby yielding a 64 k memory array (64 k×1).

In order to save space, the memory array 102 is typically fabricated with relatively high density and relatively tight pitch. Selected circuits, termed "pitch circuits," are outside of the memory array, but are preferably fabricated with the same density as the memory array 102. The pitch circuits can correspond to the circuits that interface with a row or a column of the memory array 102. For example, a dashed box 114 illustrates a configuration where the row decoders 108, the column decoders 110, and the sense amplifier circuits 112 are fabricated with the same pitch as the memory array 102.

Other circuits, termed "logic circuits," such as the row address latch 104 and the column address latch 106, as well as other circuits not shown such as buffers, additional decoding logic, state machines, counters, interfaces to microprocessors, memory arbiters, data latches, etc., can be fabricated with less density and with a wider pitch for interconnect conductors.

Figure 2:
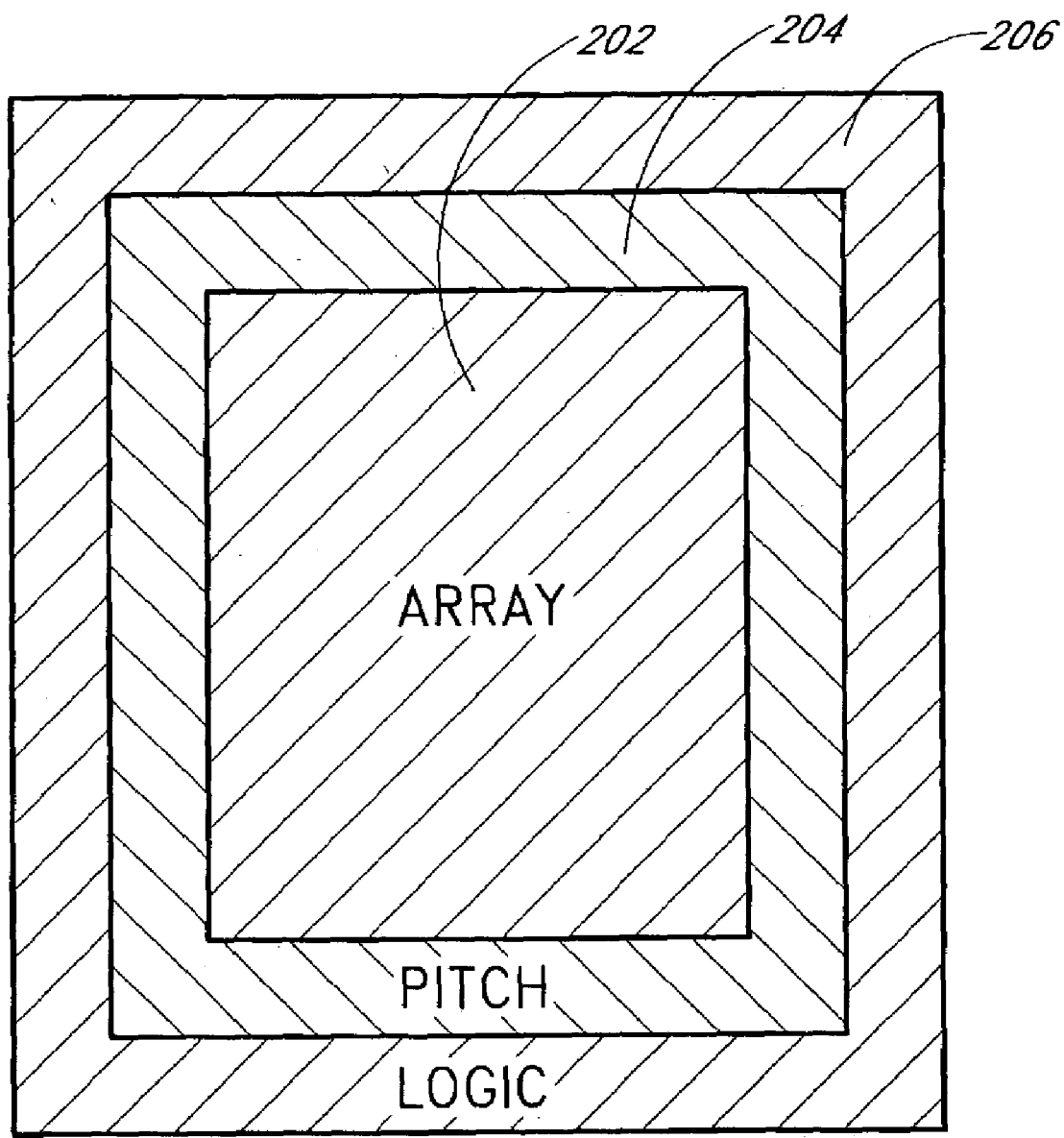
FIG. 2 is a schematic top view of a substrate assembly of an integrated circuit memory device.

FIG. 2 illustrates a top view of a substrate assembly for an integrated circuit memory device. The integrated circuit memory includes an array area 202, a pitch area 204, and a logic area 206. The array area 202 includes the memory cells and is typically fabricated with relatively high density and with relatively tight pitch for array electrodes. The pitch area 204 is also typically fabricated with relatively high density and can include interconnects fabricated with the same pitch as electrodes in the array area 202. The logic area 206 can be fabricated at a lower density and with a wider pitch than the array area 202 or the pitch area 204. Examples of benefits of lowering the density for the logic area 206 include reducing electromigration, reducing distributed capacitance from interconnects, desensitizing to production variabilities, easing connection to package pins, and the like.

Table I illustrates sample geometries for an integrated circuit memory device according to one embodiment of the invention. It will be understood that the particular geometries selected for a memory device can vary in a very broad range and can depend on a variety of factors, such as the material selected for the conductor, the desired density for the memory device, and the limitations of the equipment used to fabricate the substrate assembly.

TABLE I

| Layer | Array Electrodes | | Pitch Interconnects | | Logic Interconnects | |
| --- | --- | --- | --- | --- | --- | --- |
| | space | width | space | width | space | width |
| M1 | 0.187 | 0.204 | 0.187 | 0.204 | 0.221 | 0.204 |
| M2 | 0.204 | 0.306 | 0.204 | 0.306 | 0.204 | 0.306 |
| M3 | 0.187 | 0.442 | 0.153 | 0.170 | 0.187 | 0.442 |
| M4 | 0.179 | 0.179 | 0.179 | 0.179 | 0.179 | 0.179 |

In Table I, space refers to the gap between two adjacent conductors or lines, and width refers to the width of the conductor or line. The pitch includes both the space between conductors and the width of a conductor. The dimensions are in microns (millionths of a meter). M1–M4 relate to levels of metallization above the substrate. M1 is the closest level to the semiconductor substrate. The metallization layers can be fabricated from a variety of materials. In one embodiment, M1 and M2 correspond to metallization fabricated from aluminum. Aluminum metallization is typically formed by depositing a sheet of aluminum and removing aluminum from undesired areas with techniques such as etching. As illustrated in Table I, electrodes and interconnects in the M1 and M4 level are formed with relatively tight pitch, and M2 and M3 levels are formed with relatively large pitch. In another embodiment, the M1 and M2 metallization levels are formed from copper such as by a damascene process or a dual damascene process. In a damascene or a dual damascene process, a trench and/or a hole can be formed in a dielectric layer. For example, a trench can be etched in a layer of silicon dioxide (SiO2). Copper is formed within the trench and on the surface of the dielectric layer. A chemical mechanical polishing (CMP) process can remove copper from the tops of upper surfaces of dielectric layers, thereby leaving behind copper conductors within trenches and/or holes.

M3 and M4 represent levels of metal that form electrodes that can be formed with a relatively tight pitch for relatively high density in the memory array. Advantageously, a relatively tight pitch for an upper metallization level, such as the M4 metallization level, can be used to provide high density interconnects for logic where desired. These electrodes contact with memory cell storage devices, such as a GMR cell storage device or a TMR cell storage device in an MRAM memory array or a capacitor in a DRAM memory array. In one embodiment, the M3 and M4 metallization levels correspond to copper fabricated in a damascene or in a dual damascene process. Such copper processes can be used to form electrodes or lines with an advantageously lighter pitch than techniques that remove material, such as metallization fabricated from etched aluminum. However, the M3 and M4 metallization levels can also be fabricated from aluminum.

According to one embodiment of the invention, when electrodes for the memory array are fabricated from the M3 and M4 metallization levels, interconnects for the logic portion of the memory device are also advantageously fabricated at the same time. These interconnects can be fabricated with the same pitch as or with a different pitch than the electrodes for the memory array. For example, it can be desirable for producibility to increase the pitch for the interconnects such that the interconnects for logic have a looser pitch (less dense) than the electrodes for the memory array. The same process steps, such as dual damascene process steps, which can form relatively tight-pitch memory array electrodes, can also form relatively low-pitch logic interconnects.

In one embodiment, the M3 and M4 metallization levels also include cladding around an electrode or around an interconnect for a magnetic keeper. The cladding can be formed from a variety of magnetic materials, such as nickel-iron, and can further include barrier materials such as tantalum. The magnetic keeper, which is typically applied to the sides of an electrode that do not face an MRAM cell, focuses or confines eLectromagnetic fields about the MRAM electrodes. For example, the magnetic keeper can include magnetic material disnosed on a surface of an electrode facing away from the MRAM cell. In another example, the magnetic keeper includes magnetic material on sidewalls of the electrode. In another example, the magnetic keeper includes magnetic material disposed on sidewalls and on a surface of an electrode facing away from the MRAM cell. One embodiment of a magnetic keeper is described in U.S. Pat. No. 6,413,788 to Mark E. Tuttle, issued on Jul. 2, 2002, the entirety of which is hereby incorporated by reference.

Though desirable in the MRAM array, the magnetic keeper is not functional for a logic interconnect and is actually not desirable for simple logic interconnects. Fabrication of the magnetic keeper involves extra processing steps, and the keeper materials can occupy space that would otherwise be filled with more conductive material. Despite these disadvantages, interconnects with magnetic keepers can still be used as electrical interconnects in an integrated circuit.

By contrast, typical DRAM electrode processes are relatively ill-suited to the fabrication of interconnects. Resistivity and capacitance are not desirable attributes in the context of an electrical interconnect. Typical DRAM electrodes are fabricated from polysilicon, which is a poor conductor and would be inappropriate for electrical connection for other than very short distances. The resistivity of an interconnect fabricated from polysilicon would result in an unacceptably high RC time constant. Moreover, to achieve high density in a DRAM array, DRAM electrodes are fabricated using processes that result in a relatively rough surface to increase the per unit capacitance of an electrode. For example, hemispherical grain (HSG) structures can be used to roughen electrode surfaces in DRAMs. This would further exacerbate the RC time constant of an interconnect fabricated from polysilicon.

It wilt be understood that additional levels of metallization can be formed in the memory device as desired. For example, the memory array can be stacked in multiple levels, and memory cell storage devices, electrodes, and interconnects can correspondingly be fabricated in multiple levels. For example, additional metal levels M5 and M6 can be formed.

Figure 3:
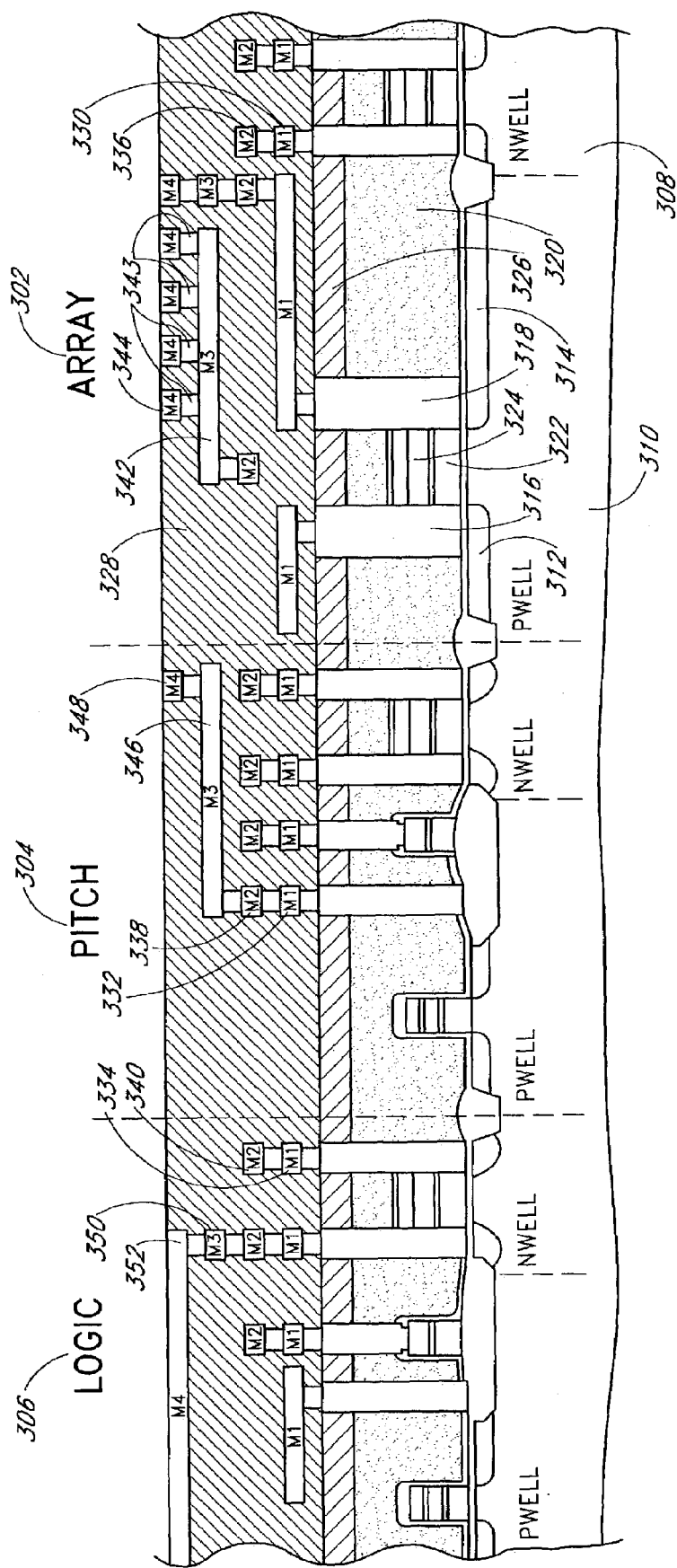
FIG. 3 illustrates a cross-sectional view of an integrated circuit memory device illustrating contemporaneously fabricated electrodes for the memory array and interconnects for logic.

FIG. 3 illustrates a cross-sectional view of an integrated circuit memory device illustrating contemporaneously fabricated electrodes for the memory array and interconnects for logic. The memory device includes an array area 302, a pitch area 304, and a logic area 306. Advantageously, the electrodes within the array area 302 and the interconnects within the pitch area 304 and the logic area 306 are fabricated at the same time, thereby decreasing fabrication steps as compared to fabricating electrodes for arrays and interconnects for circuits in separate steps. In one embodiment, the electrodes and the interconnects that are fabricated at the same time are formed to the same height, the same level, and of the same material.

Transistors are fabricated in a silicon substrate 308. The illustrated memory device includes both P-type wells and N-type wells in the silicon substrate 308 for the fabrication of complementary metal oxide semiconductor (CMOS) circuits. For example, a first N-type transistor can be fabricated in a first P-type well 310. FIG. 3 illustrates a N-type source region 312 and an N-type drain region 314 that can be formed in the first P-type well 310 of the silicon substrate 308. A first plug 316 and a second plug 318 can be used to couple the N-type source region 312 and the N-type drain region 314 to other terminals or other devices via interconnects.

The first plug 316 and the second plug 318 can be formed from, for example, tungsten. It will be understood by one of ordinary skill in the art that the first plug 316 and the second plug 318 can further include barrier materials, such as titanium and titanium nitride liner layers formed between the first plug 316 and the second plug 318 and the surrounding materials. An example of an insulator 320 that can be used around the first plug 316 and the second plug 318 includes boro-phospho-silicate-glass (BPSG).

A gate 322 for the transistor can be formed from, for example, polysilicon. The gate 322 can be coupled to an electrode via a contact 324 and a plug. In one example, the contact 324 is formed from tungsten silicide, and the plug is formed from tungsten. The memory device can include a layer 326 of a relatively hard insulator formed above the insulator 320. For example, silicon dioxide can be used for the layer 326. The layer 326 is preferably relatively hard so that chemical mechanical polishing at the upper surface of the layer 326 and plugs through the layer 326 provides an approximately level and even surface for overlying metallization layers.

The metallization layers for interconnects and electrodes are separated by layers of inter-layer dielectric (ILD) 328. Such ILD layers can include materials such as polyimide and silicon dioxide. FIG. 3 illustrates electrodes and interconnects for a first-level metallization M1 and a second-level metallization M2. The first-level M1 interconnects and the second-level M2 can be used to connect to underlying transistors and, where applicable, to capacitors in DRAM memory arrays.

In the illustrated embodiment, where the memory array corresponds to an MRAM memory array, the array-area first-level M1 electrodes 330, pitch-area first-level M1 interconnects 332, and logic-area first-level M1 interconnects 334 are formed with approximately the same pitch. The array-area second-level M2 electrodes 336, pitch-area second-level M2 interconnects 338, and logic-area second-level M2 interconnects 340 can also be formed with approximately the same pitch.

The third-level metallization M3 and the fourth-level metallization M4 can be used as electrodes for an MRAM cell storage device 343 and as interconnects in other areas. The electrodes in the array area 302 and the interconnects in the pitch area 304 and in the logic area 306 are contemporaneously fabricated for the third-level metallization M3 or the fourth-level metallization M4, thereby advantageously saving processing steps and time compared wit forming electrodes and forming interconnects in separate steps.

Array area third-level M3 electrodes 342 and array-area fourth-level M4 electrodes 344 can be used to access MRAM cell storage devices 343 in the memory array. For example, the array-area third-level M3 electrodes 342 can correspond to rows and the array-area fourth-level M4 electrodes 344 can correspond to columns. In one embodiment, the MRAM cell storage devices 343 are disposed between the array-area third-level M3 electrodes 342 and the array-area fourth-level M4 electrodes 344 such that the electrodes and the MRAM cell storage devices 343 form a "cross-point" array configuration. With relatively large size (memory size) memory arrays, the number of rows, columns, and MRAM cell storage devices can be relatively large. It is thus desirable to use relatively tight pitch geometries for rows, columns, and MRAM cell storage devices.

Pitch-area third-level M3 interconnects 346 and pitch-area fourth-level M4 interconnects 348 are contemporaneously formed with the array-area third-level M3 electrodes 342 and the array-area fourth-level M4 electrodes 344, respectively. The pitch-area third-level M3 interconnects 346 and the pitch-area fourth-level M4 interconnects 348 can be used to couple rows and columns of the memory array to the circuits that interface with the rows and columns. Examples of these interfacing circuits include row and column decoders, sense amps, driver circuits, and the like. Preferably, the pitch-area third-level M3 interconnects 346 and the pitch-area fourth-level M4 interconnects 348 are formed with the same pitch as the array-area third-level M3 electrodes 342 and the array-area fourth-level M4 electrodes 344. The pitch-area third-level M3 interconnects 346 and the pitch-area fourth-level M4 interconnects 348 can also be used to couple transistors in the substrate assembly into circuits, to couple circuits together, to provide biasing, etc.

Logic-area third-level M3 interconnects 350 are contemporaneously formed with the array-area third-level M3 electrodes 342 and the pitch-area third-level M3 interconnects 346. Logic-area fourth-level M4 interconnects 352 are similarly contemporaneously formed with the array-area fourth-level M4 electrodes 344 and the pitch-area fourth-level M4 interconnects 348. The logic-area third-level M3 interconnects 350 and the logic-area fourth-level M4 interconnects 352 form electrical interconnects between circuits. The interconnects can be used for a variety of purposes, such as to couple transistors in the substrate assembly into circuits, to couple circuits together, to provide biasing, to couple the substrate assembly to pads for bonding to external package pins, etc. Typically, the density of the circuits in the logic area 306 is much lower than the density of the array area 302. Correspondingly, the pitch, i.e., width and spacing, of interconnects in the logic area 306 is preferably relaxed from the relatively-tight pitch selected for the array area 302.

It will be understood by one of ordinary skill in the art that in an alternative embodiment, the memory device can include additional stacked memory arrays, including further levels of dielectric, metallization, and memory cell storage device layers. For example, the memory device can include further metallization layers, such as M5, M6, etc. These additional dielectric, memory cell storage device, and metallization layers can be used to increase the memory size of the array area 302, to provide additional levels of interconnects, etc.

A wide variety of materials can be used for the metallization layers. In one embodiment, the first-level M1 metallization and the second-level M2 metallization are formed from aluminum, and the third-level M3 metallization and the fourth-level M4 metallization are formed from copper. In another embodiment, the first-level M1 metallization, the second-level M2 metallization, the third-level M3 metallization, and the fourth-level M4 metallization are all formed from copper.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. An integrated circuit memory device comprising:
   a semiconductor substrate assembly;
   a memory array with a plurality of memory cells disposed above the semiconductor substrate assembly;
   a plurality of metallization layers disposed above the substrate assembly, where at least one metallization layer is configured to provide electrodes for memory cell storage devices of the memory array and is also configured to provide interconnects for a logic circuit area, wherein the electrodes and the interconnects in the same metallization layer further include cladding of a magnetic material to form magnetic keepers; and
   a plurality of interlayer dielectric layers disposed between metallization layers.

2. The integrated circuit memory device as defined in claim 1, further comprising a barrier of tantalum disposed between the cladding and a dielectric layer.

3. The integrated circuit memory device as defined in claim 1, where a height and a material for the electrodes and the interconnects in the metallization layer are the same.

4. The integrated circuit memory device as defined in claim 1, wherein the metallization layer comprises copper.

5. The integrated circuit memory device as defined in claim 1, wherein the metallization layer comprises aluminum.

6. An integrated circuit memory device comprising:
a semiconductor substrate assembly;
a memory array with a plurality of memory cells disposed above the semiconductor substrate assembly;
a plurality of metallization layers disposed above the substrate assembly, where at least one metallization layer is configured to provide electrodes for memory cells of the memory array and is also configured to provide interconnects for a logic circuit area, wherein the memory cells are magnetoresistive random access memory (MRAM) cells, wherein the electrodes and the interconnects in the same metallization layer further include cladding of a magnetic material to form magnetic keepers; and
a plurality of interlayer dielectric layers disposed between metallization layers.

7. An integrated circuit memory device comprising:
a semiconductor substrate assembly;
a memory array with a plurality of memory cells disposed above the semiconductor substrate assembly wherein the memory cell storage devices are programmable conductor random access memory (PCRAM) cell storage devices;
a plurality of metallization layers disposed above the substrate assembly, where at least one metallization layer is configured to provide electrodes for memory cell storage devices of the memory array and is also configured to provide interconnects for a logic circuit area; and
a plurality of interlayer dielectric layers disposed between metallization layers.

8. The integrated circuit memory device as defined in claim 1, wherein the logic circuit area comprises at least one circuit selected from the group consisting of buffers, state machines, counters, interfaces to microprocessors, memory arbiters, and data latches.

9. An integrated circuit memory device comprising:
a semiconductor substrate assembly;
a memory array with a plurality of memory cells disposed above the semiconductor substrate assembly;
a plurality of metallization layers disposed above the substrate assembly, where at least one metallization layer is configured to provide electrodes for memory cells of the memory array and is also configured to provide interconnects for a logic circuit area; and
a plurality of interlayer dielectric layers disposed between metallization layers;
and
a pitch circuit area disposed at least between the memory array and the logic circuit area, where the metallization layer in the pitch circuit area includes interconnects to the memory array, and where at least a portion of the interconnects in the pitch circuit area have the same pitch as the electrodes in the memory array.

10. The integrated circuit memory device as defined in claim 1, further comprising a pitch circuit area disposed at least between the memory array and the logic circuit area, where the metallization layer in the pitch circuit area includes interconnects to the memory array, where at least a portion of the interconnects in the pitch circuit area have the same pitch as the electrodes in the memory array, and where the pitch circuit area comprises at least one circuit selected from the group consisting of a row decoder, a column decoder, a current sense circuit, or a driver circuit.

11. The integrated circuit memory device as defined in claim 6, further comprising a barrier of tantalum disposed between the cladding and a dielectric layer.

12. The integrated circuit memory device as defined in claim 9, where the pitch circuit area comprises at least one circuit selected from the group consisting of a row decoder, a column decoder, a current sense circuit, or a driver circuit.

13. The integrated circuit memory device as defined in claim 1, wherein the memory cell storage devices are magnetoresistive random access memory (MRAM) cell storage devices.

14. The integrated circuit memory device as defined in claim 9, wherein the memory cell storage devices are dynamic random access memory (DRAM) capacitors.

15. The integrated circuit memory device as defined in claim 1, wherein the memory array is arranged in a cross-point array configuration.

16. The integrated circuit memory device as defined in claim 1, wherein the cladding of magnetic material is disposed on the sides of electrodes that do not face the memory cells.

17. The integrated circuit memory device as defined in claim 1, wherein the cladding of magnetic material is disposed on surfaces facing away from the memory cells.

18. The integrated circuit memory device as defined in claim 1, wherein the cladding of magnetic material is disposed along sidewalls of electrodes.

19. The integrated circuit memory device as defined in claim 1, further comprising a pitch circuit area disposed at least between the memory array and the logic circuit area, where the metallization layer in the pitch circuit area includes interconnects to the memory array, and where at least a portion of the interconnects in the pitch circuit area have the same pitch as the electrodes in the memory array.

20. The integrated circuit memory device as defined in claim 6, further comprising a pitch circuit area disposed at least between the memory array and the logic circuit area, where the metallization layer in the pitch circuit area includes interconnects to the memory array, and where at least a portion of the interconnects in the pitch circuit area have the same pitch as the electrodes in the memory array.

21. The integrated circuit memory device as defined in claim 7, further comprising a pitch circuit area disposed at least between the memory array and the logic circuit area, where the metallization layer in the pitch circuit area includes interconnects to the memory array, and where at least a portion of the interconnects in the pitch circuit area have the same pitch as the electrodes in the memory array.

22. The integrated circuit memory device as defined in claim 9, wherein the memory cell storage devices are magnetoresistive random access memory (MRAM) cell storage devices.

23. The integrated circuit memory device as defined in claim 9, wherein the memory cell storage devices are programmable conductor random access memory (PCRAM) cell storage devices.

* * * * *